United States Patent
George et al.

(10) Patent No.: US 10,902,169 B1
(45) Date of Patent: Jan. 26, 2021

(54) FUNCTIONAL COVERAGE ENHANCEMENT IN PORTABLE STIMULUS GRAPHS

(71) Applicant: International Business Machines Corporation, Armonk, NY (US)

(72) Inventors: Joji P. George, Bangalore (IN); Kousik Dan, Bangalore (IN); Nitish Jindal, Bangalore (IN); Sandeep Korrapati, Bangalore (IN); Amarnath Thulabanthula, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/678,514

(22) Filed: Nov. 8, 2019

(51) Int. Cl.
- *G06F 30/30* (2020.01)
- *G06F 30/33* (2020.01)
- *G06F 16/24* (2019.01)
- *G06F 30/3323* (2020.01)
- *G06F 16/2455* (2019.01)

(52) U.S. Cl.
CPC ...... *G06F 30/3323* (2020.01); *G06F 16/2455* (2019.01); *G06F 30/30* (2020.01)

(58) Field of Classification Search
CPC ... G06F 12/2455; G06F 30/30; G06F 30/3323
USPC .......................................... 716/100, 101, 106
See application file for complete search history.

(56) References Cited

U.S. PATENT DOCUMENTS

| | | | |
|---|---|---|---|
| 4,763,289 A * | 8/1988 | Barzilai et al. ......... | G06F 30/33 703/2 |
| 6,321,186 B1 * | 11/2001 | Yuan et al. ......... | G06F 30/3323 703/15 |
| 6,502,232 B1 * | 12/2002 | Campenhout .. | G01R 31/318357 716/106 |
| 6,968,514 B2 * | 11/2005 | Cooke et al. ........... | G06F 30/30 716/102 |
| 7,509,600 B2 * | 3/2009 | Rajski et al. ..... | G01R 31/31835 716/106 |
| 8,578,319 B2 * | 11/2013 | Papanikolaou et al. ..................... | G06F 30/30 716/132 |
| 9,633,153 B1 * | 4/2017 | Khaikin et al. ......... | G06F 30/33 |
| 9,817,930 B1 * | 11/2017 | Campos et al. ........ | G06F 30/18 |
| 2016/0196197 A1 | 7/2016 | Hamid et al. | |

(Continued)

OTHER PUBLICATIONS

Horbach et al., "Walking the Graph (A holistic approach to graph-based verification for logic with sparse state space)", 2015 IBM, Technical Presentation View Graphs, one set (9 pages).*

(Continued)

*Primary Examiner* — Sun J Lin

(74) *Attorney, Agent, or Firm* — Patterson + Sheridan, LLP

(57) ABSTRACT

A method, system, and computer program product are described for use with graph-based verification of a circuit design. The method comprises performing, using a graph referencing the circuit design, a predefined set of one or more test sequences. The method further comprises determining that a first coverage point of the graph is not fully hit by the predefined set, and back-traversing the graph from a second coverage point of the graph that is partially hit or fully hit by the predefined set. The method further comprises generating, based on back-traversing the graph, a prospective test sequence to fully hit the first coverage point.

20 Claims, 5 Drawing Sheets

(56) References Cited

U.S. PATENT DOCUMENTS

2018/0253512 A1      9/2018  Green
2019/0251219 A1*     8/2019  Behrend et al. .... G06F 30/3323

OTHER PUBLICATIONS

Hamid, A., "The Verification Times Are Changing," System Design Engineering Community, Apr. 17, 2017, 3 pages.
Hamid, A., "Using Portable Stimulus to Verify an ARMV8 Sub-System Integration on an SOC," DVCON, Design Verification Conference and Exhibition, Apr. 17, 2019, 1 page.
Gargantini et al., "ASM-based Testing: Coverage Criteria and Automatic Test Sequence Generation," Journal of Universal Computer Science, vol. 7, No. 11 (2001), pp. 1050-1067.
Heimdahl et al., "Auto-generating Test Sequences using Model Checkers: A Case Study," 10 pages, abstract only.
TrekUVM White Paper, "Why Graph-Based Verification? Don't Push on a Rope," 2014, 3 pages.
Thomas L. Anderson, "Coverage is the heart of verification," Feb. 14, 2005, 8 pages.

* cited by examiner

FUNCTIONAL COVERAGE ENHANCEMENT IN PORTABLE STIMULUS GRAPHS

BACKGROUND

The present disclosure relates to graph-based verification of circuit designs, and more specifically, to generating test sequences to increase functional coverage enhancement.

In recent years, coverage-driven verification has gained popularity with increasingly complex circuit designs and increasingly constrained schedules. Coverage-driven verification is a results-oriented approach to functional verification of circuit designs. Generally, coverage-driven verification includes defining functional coverage points, running tests and analyzing the functional coverage, and iteratively closing in on the remaining functional coverage.

SUMMARY

According to one embodiment, a method is disclosed for use with graph-based verification of a circuit design. The method comprises performing, using a graph referencing the circuit design, a predefined set of one or more test sequences. The method further comprises determining that a first coverage point of the graph is not fully hit by the predefined set, and back-traversing the graph from a second coverage point of the graph that is partially hit or fully hit by the predefined set. The method further comprises generating, based on back-traversing the graph, a prospective test sequence to fully hit the first coverage point.

According to another embodiment, a system comprises a memory storing a graph referencing a circuit design, and one or more computer processors. The one or more computer processors are configured to perform, using the graph, a predefined set of one or more test sequences. The one or more computer processors are further configured to determine that a first coverage point of the graph is not fully hit by the predefined set, and back-traverse the graph from a second coverage point of the graph that is partially hit or fully hit by the predefined set. The one or more computer processors are further configured to generate, based on back-traversing the graph, a prospective test sequence to fully hit the first coverage point.

According to another embodiment, a computer program product is disclosed for use with graph-based verification of a circuit design. The computer program product comprises a computer-readable storage medium having computer-readable program code embodied therewith, the computer-readable program code executable by one or more computer processors to perform an operation, comprising performing, using a graph referencing the circuit design, a predefined set of one or more test sequences. The operation further comprises determining that a first coverage point of the graph is not fully hit by the predefined set, and back-traversing the graph from a second coverage point of the graph that is partially hit or fully hit by the predefined set. The operation further comprises generating, based on back-traversing the graph, a prospective test sequence to fully hit the first coverage point.

DETAILED DESCRIPTION

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments, and advantages are merely illustrative and are not considered elements or limitations of the appended claims except where explicitly recited in a claim(s). Likewise, any reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module," or "system."

Figure 1:
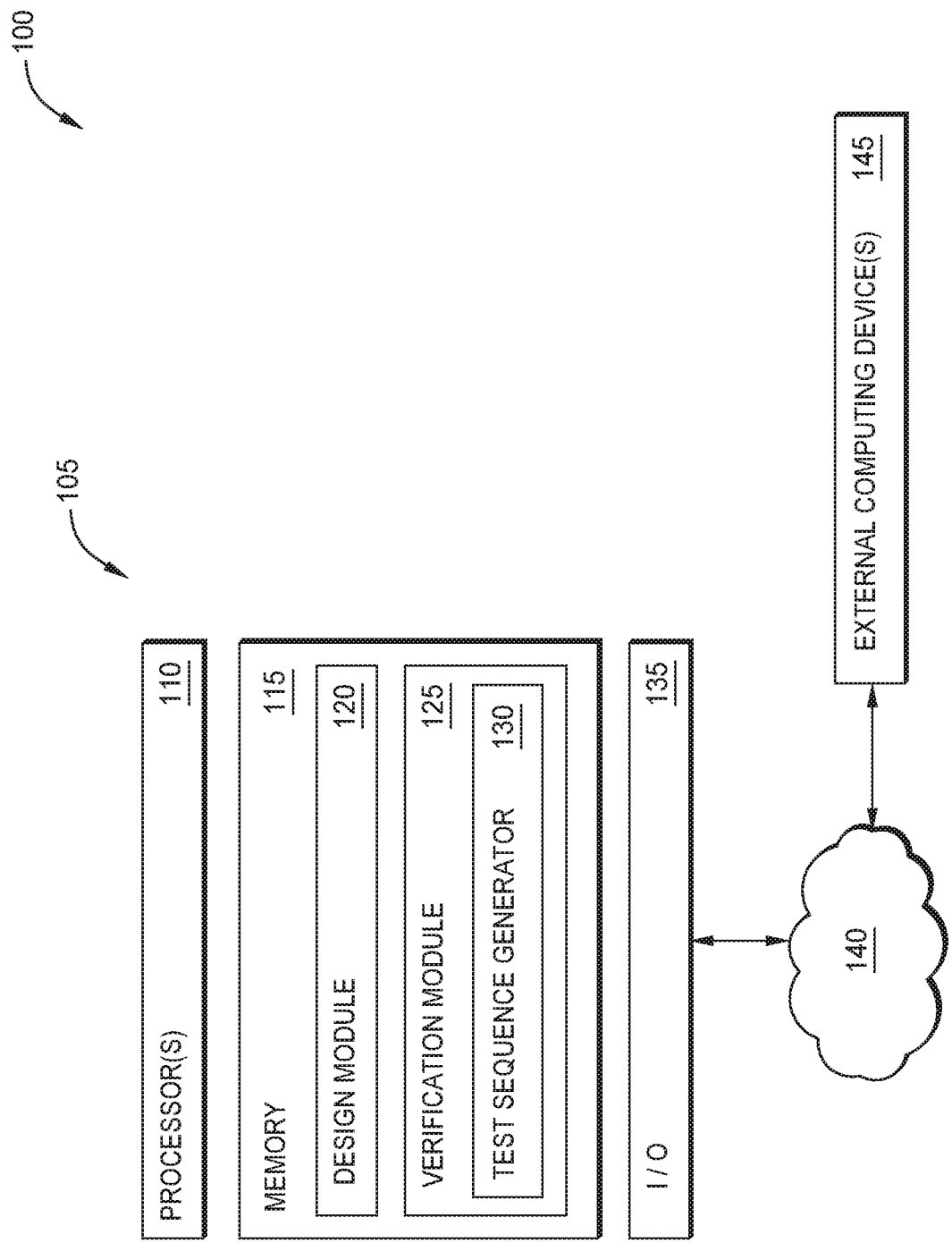
FIG. 1 is a block diagram illustrating an exemplary system for graph-based verification of a circuit design, according to one or more embodiments.

FIG. 1 is a block diagram illustrating an exemplary system 100 for graph-based verification of a circuit design, according to one or more embodiments. The system 100 comprises a computing device 105 communicatively coupled with one or more external computing devices 145 via a network 140. The computing device 105 comprises one or more processors 110, a memory 115, and input/output (I/O) 135. The one or more processors 110 may be implemented in any suitable form, such as a general purpose microprocessor, a controller, an application-specific integrated circuit (ASIC), and so forth. The memory 115 may include a variety of computer-readable media selected for their size, relative performance, or other capabilities: volatile and/or non-volatile media, removable and/or non-removable media, etc. Further, the one or more processors 110 and/or the memory 115 may be included in a single computing device, or may be distributed among multiple communicatively-coupled computing devices.

The memory 115 may include one or more "modules" or "sub-modules" for performing various functions described herein. In one embodiment, each module or sub-module includes program code that is executable by the one or more processors 110. However, other embodiments may have functionality that is partially or fully implemented in hardware (i.e., circuitry) or firmware of the system 100. As shown, the system 100 comprises a design module 120, and a verification module 125, although other combinations of the described functionality are also contemplated.

The design module 120 performs various functions related to circuit design. For example, the design module 120 may perform one or more of: high-level synthesis (e.g., converting high-level design description into register-transfer level (RTL), logic synthesis (e.g., converting RTL into a netlist of logic gates), schematic capture, layout, and simulation. Each of the design functions will be understood by the person of ordinary skill in the art. The verification module 125 performs various functions related to verification of the circuit design. For example, the verification module 125 may perform functional verification of the circuit design, timing analysis, physical verification, and so forth.

In some embodiments, the verification module 125 defines a plurality of functional coverage points, and performs a predefined set of one or more test sequences, using a graph referencing the circuit design. Defining the plurality of functional coverage points may be performed using any suitable techniques, such as a test plan review. In some embodiments, the functional coverage comprises code that observes execution of a test plan. As such, the code is written to track whether important values, sets of values, or sequences of values that correspond to design or interface requirements, features, or boundary conditions have been exercised. In some embodiments, the code comprises a hardware description language such as SystemVerilog, and the function coverage is represented as "cover points", e.g., Finite State Machine states of the circuit design.

The verification module 125 analyzes the functional coverage of the one or more test sequences of the predefined set, relative to the plurality of functional coverage points. The verification module 125 may determine that a first coverage point is not fully hit by the predefined set. In some cases, the first coverage point may be "partially hit" where some but not all of the constituent parts of the coverage point are covered by the one or more test sequences. In other cases, the one or more test sequences do not hit the coverage point (that is, none of the constituent parts are covered).

In some embodiments, the verification module 125 back-traverses the graph from a second coverage point that is partially hit or fully hit by the predefined set. In some embodiments, the first coverage point is partially hit by the predefined set, and the verification module 125 back-traverses the graph from the first coverage point. In other embodiments, the first coverage point is not hit by the predefined set, and the verification module 125 determines whether the first coverage point has a sibling coverage point at a same hierarchical level of the graph. When the sibling coverage point exists, the verification module 125 back-traverses the graph from the sibling coverage point. When the sibling coverage point does not exist, the verification module 125 back-traverses the graph from a parent coverage point of the first coverage point. The verification module 125 comprises a test sequence generator 130 that generates a prospective test sequence to fully hit the first coverage point.

The I/O 135 comprises any suitable hardware for communicatively connecting the computing device 105 with the network 140. In some embodiments, the I/O 135 comprises a network adapter card or a network interface (e.g., integrated into a computer motherboard). The network 140 may represent one or more networks of any suitable type(s) for communicatively coupling the computing device 105 with the one or more external computing devices 145. For example, the network 140 may comprise the Internet, a local area network (LAN), a wide area network (WAN), and/or a wireless network. The network 140 may comprise copper transmission cables, optical transmission fibers, wireless transmission, routers, firewalls, switches, gateway computers, and/or edge servers.

The one or more external computing devices 145 may be similarly configured as the computing device 105 (e.g., comprising one or more computer processors, a memory, and an I/O). Although the design module 120 and the verification module 125 are depicted as being included in the computing device 105, in other embodiments some or all of the functionality of the design module and/or the verification module 125 are implemented in the one or more external computing devices 145. In one example, the verification module 125 is implemented in the computing device 105 and the design module 120 is implemented in one of the external computing devices 145.

Figure 2:
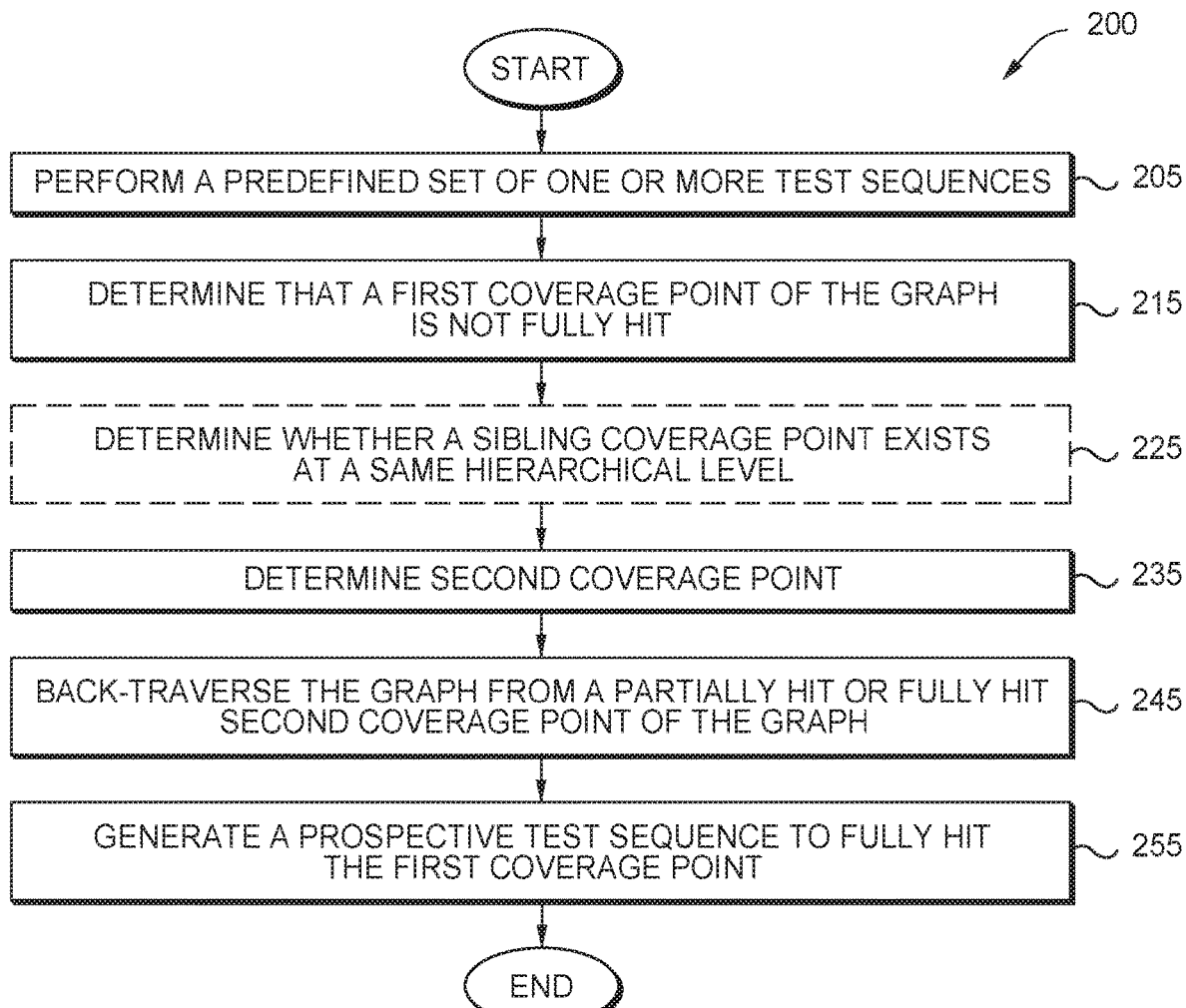
FIG. 2 is an exemplary method for use with graph-based verification of a circuit design, according to one or more embodiments.

FIG. 2 is an exemplary method 200 for use with graph-based verification of a circuit design, according to one or more embodiments. The method 200 may be used in conjunction with other embodiments, e.g., performed using the verification module 125 of FIG. 1.

The method 200 begins at block 205, where the verification module performs a predefined set of one or more test sequences. At block 215, the verification module determines that a first coverage point of the graph is not fully hit. At an optional block 225, the verification module determines whether a sibling coverage point exists at a same hierarchical level of the graph. The block 225 may be performed where the one or more test sequences do not hit the first coverage point (that is, none of the constituent parts are covered).

At block 235, the verification module determines a second coverage point. In the case where the one or more test sequences partially hit the first coverage point, the second coverage point may be the same as the first coverage point. In the case where the one or more test sequences do not hit the first coverage point, and the sibling coverage point exists, the second coverage point is the sibling coverage point. In the case where the one or more test sequences do not hit the first coverage point, and the sibling coverage point does not exist, the second coverage point is a parent coverage point of the first coverage point. At block 245, the verification module back-traverses the graph from a partially hit or fully hit second coverage point of the graph. At block 255, the verification module generates a prospective test sequence to fully hit the first coverage point. The method 200 ends following completion of block 255.

Figure 3:
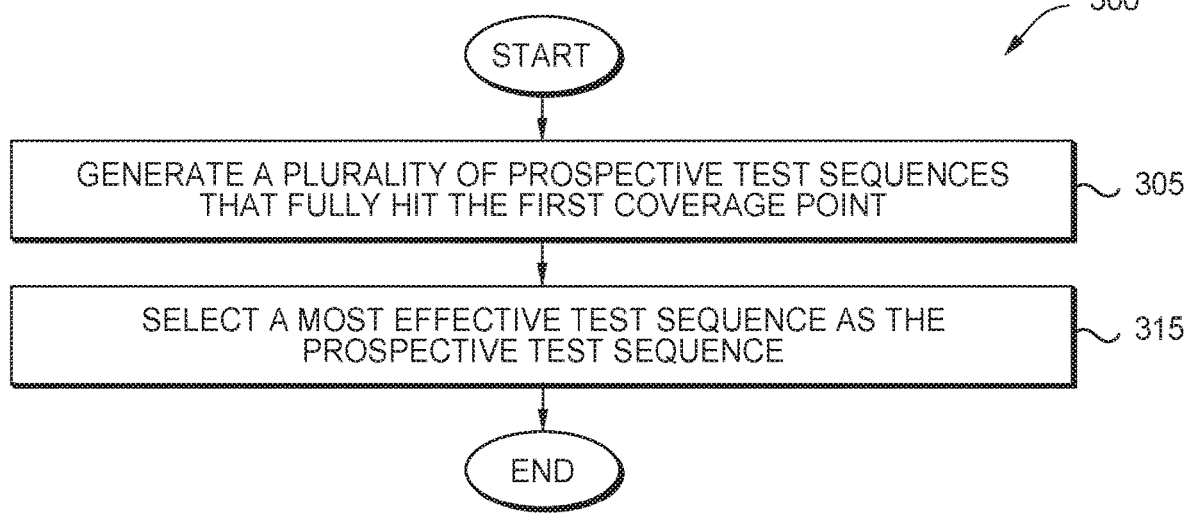
FIG. 3 is an exemplary method for generating a prospective test sequence to fully hit a coverage point, according to one or more embodiments.

FIG. 3 is an exemplary method 300 for generating a prospective test sequence to fully hit a coverage point, according to one or more embodiments. The method 300 may be used in conjunction with other embodiments, e.g., representing one exemplary implementation of block 255 of the method 200.

The method 300 begins at block 305, where the verification module generates a plurality of prospective test sequences that fully hits the first coverage point. At block 315, the verification module selects a most effective test sequence as the prospective test sequence. In some embodiments, selecting the most effective test sequence comprises selecting the test sequence that covers a greatest number of events. The method 300 ends following completion of block 315.

Figure 4:
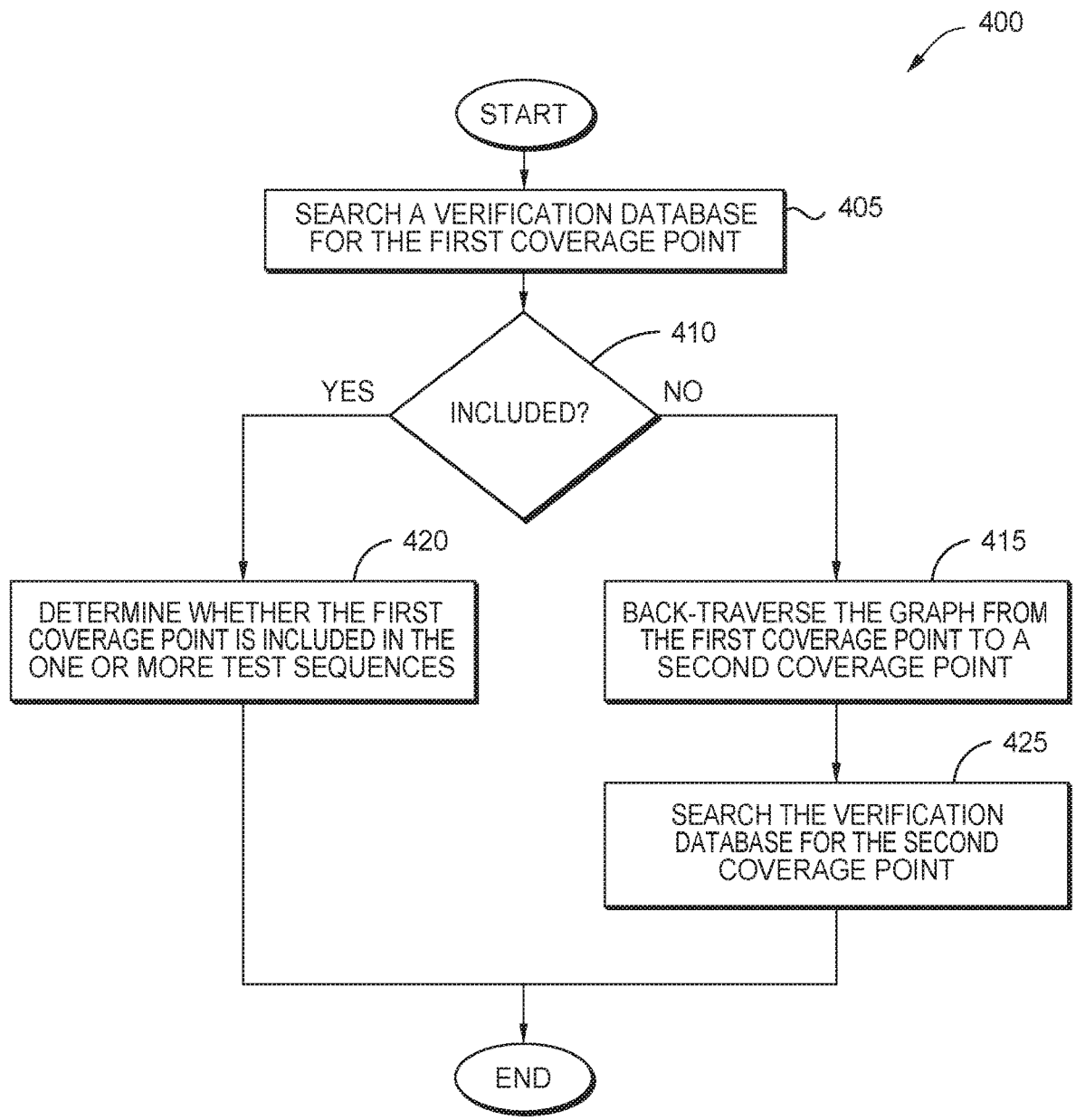
FIG. 4 is an exemplary method for determining that a coverage point of a graph is not fully hit, according to one or more embodiments.

FIG. 4 is an exemplary method 400 for determining that a coverage point of a graph is not fully hit, according to one or more embodiments. The method 400 may be used in conjunction with other embodiments, e.g., one exemplary implementation of block 215 of the method 200.

The method 400 begins at block 405, where the verification module searches a verification database for the first coverage point. In some embodiments, the verification database includes one or more simulated or completed test cases, and one or more verification environment files. At block 410, the verification module determines whether the first coverage point is included in the verification database. If the first coverage point is included ("Y"), the method 400 proceeds to block 420, where the verification module determines whether the first coverage point is included in the one or more test sequences.

If the first coverage point is not included ("N"), the method 400 proceeds to block 415, and the verification module back-traverses the graph from the first coverage point to a second coverage point. In the cases where the method 400 is used within block 215 of the method 200, the second coverage point may be a third coverage point that is distinct from the second coverage point described in the blocks 235, 245. At block 425, the verification module searches the verification database for the second coverage point. The method 400 ends following completion of block 420 or block 425.

Figure 5A:
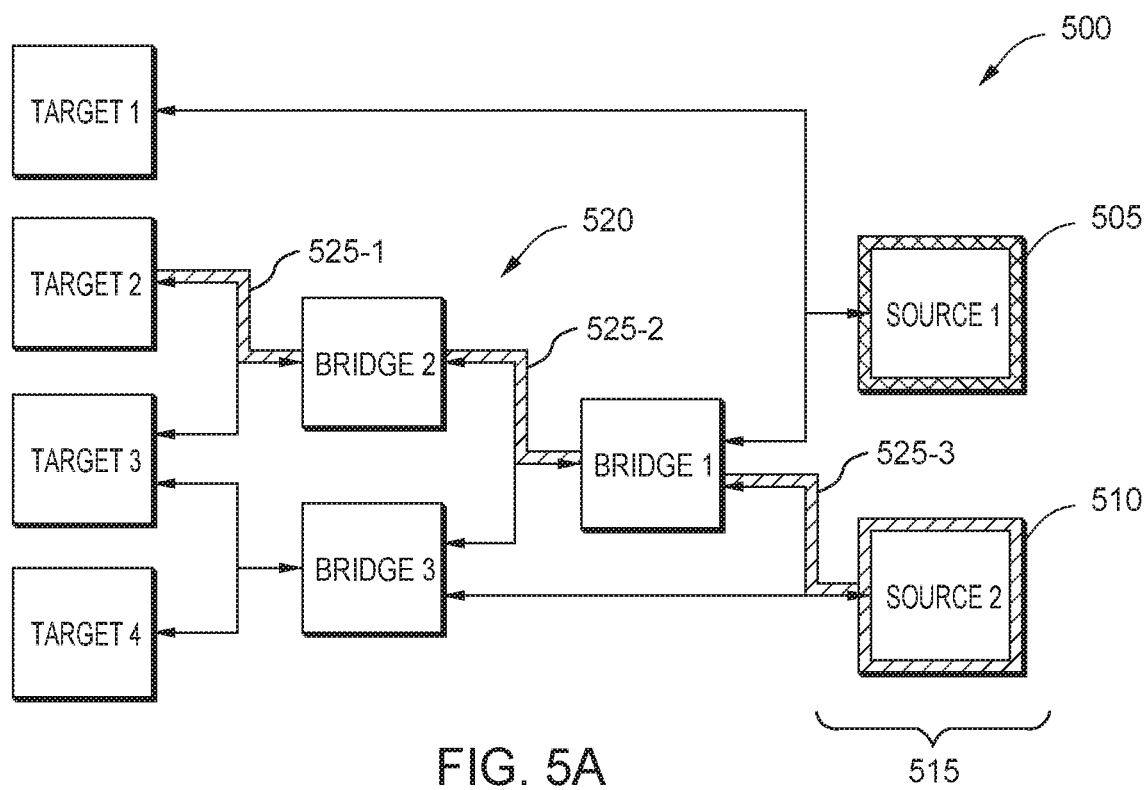
FIGS. 5A and 5B are block diagrams illustrating back-traversing a graph, according to one or more embodiments.
Figure 5B:
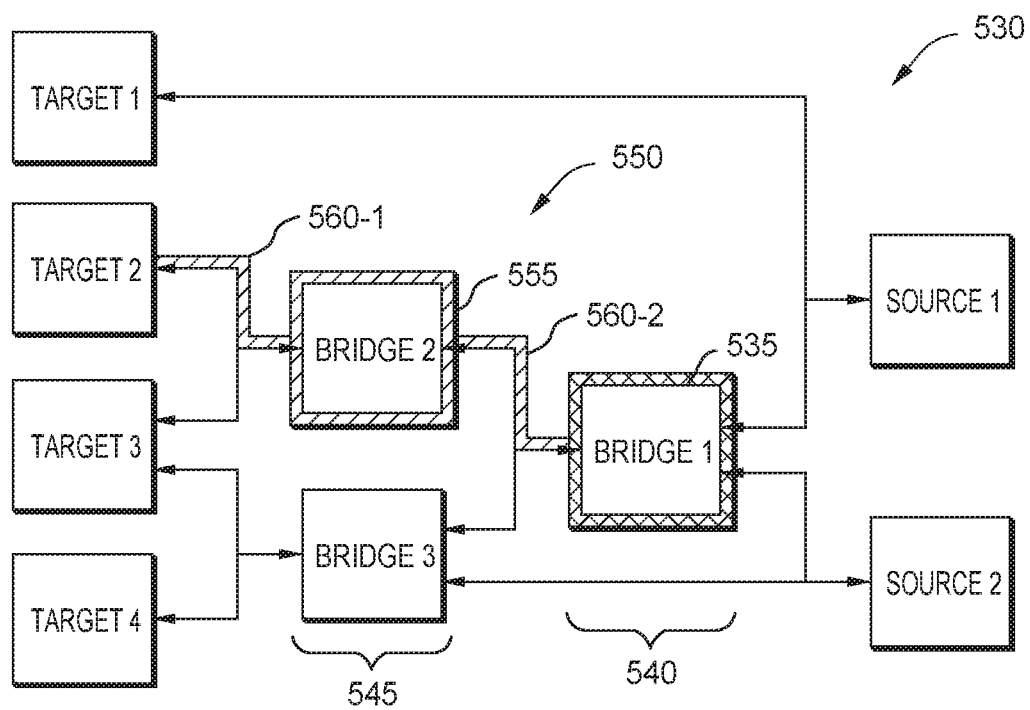

FIGS. 5A and 5B are block diagrams 500, 530 illustrating back traversing a graph, according to one or more embodiments. The features illustrated in the block diagrams 500, 530 may be used in conjunction with other embodiments, e.g., as examples of performing the method 200 of FIG. 2.

The block diagrams 500, 530 show a representative example of a circuit design. As shown, the circuit design has two (2) source blocks configured to receive requests from an external device, and four (4) possible targets for the requests. Three (3) bridges are generally arranged between the sources and the targets. The bridges may have any suitable functionality. For example, the three bridges may support asynchronous data of different speeds at the sources and targets, may support different-sized sources and targets, may support address translation between sources and targets, and so forth.

In some cases, the operation of the bridges may be sensitive to alignment and timing. For example, a bridge may require that data from different sources arrive within a certain period of time and that the data be properly aligned. The operation of the bridges may further rely on configuration registers that indicate how the addresses will be translated. Thus, a very specific sequence of events must occur to send or receive data using the circuit design. Achieving the sequence of events using constrained-random stimulus on the source inputs is challenging.

As shown, Source 1 and Source 2 are arranged in a hierarchical level 515. Bridge 1 is arranged in a hierarchical level 540, and Bridge 2 and Bridge 3 are arranged in a hierarchical level 545. The Source 1 is connected to Target 1 and to Bridge 1, and Source 2 is connected to the Bridge 1 and to the Bridge 3. The Bridge 1 is connected to the Bridge 2 and to the Bridge 3. The Bridge 2 is connected to the Target 2 and to the Target 3, and the Bridge 3 is connected to the Target 3 and to the Target 4.

In the block diagram 500, the Source 1 represents a first coverage point 505, which is not hit when the verification module performs the one or more test sequences of the predefined set. The Source 2 represents a second coverage point 510 that is partially hit or fully hit by the predefined set.

As discussed herein, the second coverage point 510 may be partially hit where some but not all of the constituent parts of the second coverage point 510 are covered by the one or more test sequences. The second coverage point 510 is partially hit by an event 520 occurring responsive to the one or more test sequences. Here, the one or more test sequences do not cover all of the constituent parts of the second coverage point 510 (e.g., Bridge 3 and Target 4). The event 520 is represented by path segments 525-1, 525-2, 525-3, where the path segment 525-1 connects the Target 2 and the Bridge 2, the path segment 525-2 connects the Bridge 2 and the Bridge 1, and the path segment 525-3 connects the Bridge 1 and the Source 2.

The verification module determines that the first coverage point 505 is not fully hit by the predefined set. In some embodiments, responsive to determining that the first coverage point 505 is not hit by the predefined set, the verification module determines that the second coverage point 510 is a sibling coverage point existing at the same hierarchical level 515. The verification module back-traverses the graph from the second coverage point 510 (e.g., along the path segments 525-1, 525-2, 525-3). By back-traversing the graph, the verification module may determine which inputs are needed to yield each possible result.

In some embodiments, the verification module performs randomization when generating a prospective test sequence that is designed or expected to fully hit (or at least, increase the functional coverage) of the first coverage point 505. In one example, the verification module may perform randomization at decision points, e.g., selecting between Bridge 2 and Bridge 3 for providing the input to the Target 3. In another example, address values and/or data values may also be randomized as with constrained-random test techniques.

In the block diagram 530, the Bridge 1 represents a first coverage point 535, which is partially hit (although not fully hit) when the verification module performs the one or more test sequences of the predefined set. The first coverage point 535 is partially hit by an event 550 occurring responsive to the one or more test sequences. The event 550 is represented by path segments 560-1, 560-2, where the path segment 560-1 connects the Target 2 and the Bridge 2, and the path segment 560-2 connects the Bridge 2 and the Bridge 1.

In some embodiments, responsive to determining that the first coverage point 535 is partially hit by the predefined set, the verification module determines that a sibling coverage point does not exist at the same hierarchical level 540 as the first coverage point 535. In this case, the verification module selects a parent coverage point (of a different hierarchical level 545) as the second coverage point 555, which serves as the starting point for back-traversing the graph. By back-traversing the graph, the verification module determines which inputs are needed to yield each possible result. As discussed above, the verification module may perform randomization when generating a prospective test sequence that is designed or expected to fully hit (or at least, increase the coverage) of the first coverage point 535.

Figure 6:
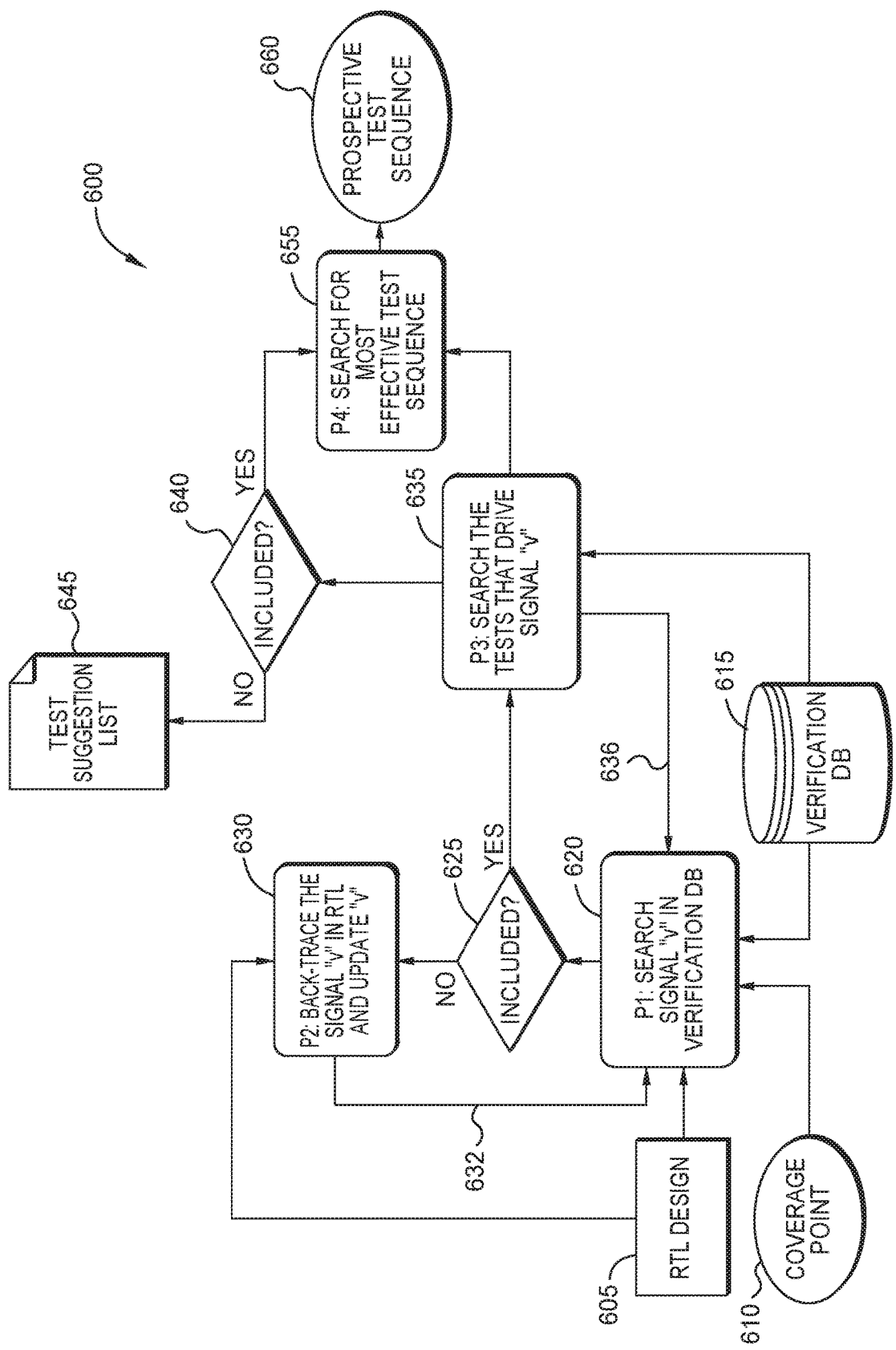
FIG. 6 is a data flow block diagram illustrating an exemplary sequence for generating a prospective test sequence, according to one or more embodiments.

FIG. 6 is a block diagram 600 illustrating an exemplary sequence for generating a prospective test sequence, according to one or more embodiments. The features of FIG. 6 may be used in conjunction with other embodiments, such as an example of performing the method 200 of FIG. 2.

In the block diagram 600, the verification module receives a RTL design 605 (e.g., one example of a graph referencing a circuit design) and a coverage point 610. In some cases, the coverage point 610 may be one of a plurality of coverage points represented as: C≤f(V). At block 620, the verification module searches a signal v in a verification database (DB) 615. The signal v may have the value v=V.start corresponding to the coverage point 610. At block 625, if the signal v is not included in the verification DB 615 ("N"), the sequence proceeds to block 630, where the verification module back-traces the signal v in the RTL design 605 and updates the value of the signal v. The sequence returns from the block 630 to the block 620 along path 632.

At block 625, if the signal v is included in the verification DB 615 ("Y"), the sequence proceeds to block 635, where the verification module searches for tests that drive the signal v. At block 640, if the signal v is not driven by the particular test ("N"), the sequence proceeds to block 645 and the test is added to a test suggestion list. If the signal v is included in the particular test ("Y"), the sequence proceeds to block 655. The sequence returns from the block 635 to the block 620 and a next signal v (corresponding to a next coverage point) is searched in the verification DB 615. Returning to the block 620 generally continues until v=BTS [V.end], where BTS represents a back-tracing source function. In some embodiments, when v=BTS[V.end], the sequence proceeds from the block 635 to the block 655, where the verification module searches for a most effective test sequence. In some embodiments, selecting the most effective test sequence comprises selecting the test sequence from the test suggestion list 645 that covers a greatest number of events. Other criteria for selecting the most effective test sequence are also contemplated. The verification module selects a prospective test sequence 660. In some embodiments, the most effective test sequence is selected as the prospective test sequence 660. In other embodiments, the most effective test sequence need not be determined. For example, after reaching v=BTS[V.end] at the block 635, the test suggestion list 645 contains all of the test cases that are calculated to hit the coverage point 610. Any of the test cases that are reflected in the test suggestion list 645 may be selected as the prospective test sequence 660.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method for use with graph-based verification of a circuit design, the method comprising:
    performing, using a graph referencing the circuit design, a predefined set of one or more test sequences;
    determining that a first coverage point of the graph is not fully hit by the predefined set;
    back-traversing the graph from a second coverage point of the graph that is partially hit or fully hit by the predefined set; and
    generating, based on back-traversing the graph, a prospective test sequence to fully hit the first coverage point.

2. The method of claim 1, further comprising:
    determining whether a sibling coverage point exists at a same hierarchical level of the graph as the first coverage point,
    wherein, when the sibling coverage point exists at the same hierarchical level, the second coverage point is the sibling coverage point.

3. The method of claim 2,
    wherein, when the sibling coverage point does not exist at the same hierarchical level, the second coverage point is a parent coverage point of the first coverage point.

4. The method of claim 1,
    wherein, when the first coverage point is partially hit by the predefined set, the second coverage point is the first coverage point.

5. The method of claim 1, wherein the generating the prospective test sequence comprises:
    generating, based on back-traversing the graph, a plurality of prospective test sequences that fully hit the first coverage point; and
    selecting, from the plurality of prospective test sequences, a most effective test sequence as the prospective test sequence.

6. The method of claim 1, wherein the determining that the first coverage point of the graph is not fully hit comprises:
    searching a verification database for the first coverage point; and
    when the first coverage point is included in the verification database, determining whether the first coverage point is included in the one or more test sequences.

7. The method of claim 6, further comprising:
    when the first coverage point is not included in the verification database, back-traversing the graph from the first coverage point to a third coverage point; and
    searching the verification database for the third coverage point.

8. A system comprising:
    a memory storing a graph referencing a circuit design; and
    one or more computer processors configured to:
        perform, using the graph, a predefined set of one or more test sequences;
        determine that a first coverage point of the graph is not fully hit by the predefined set;
        back-traverse the graph from a second coverage point of the graph that is partially hit or fully hit by the predefined set; and
        generate, based on back-traversing the graph, a prospective test sequence to fully hit the first coverage point.

9. The system of claim 8, wherein the one or more computer processors are further configured to:
    determine whether a sibling coverage point exists at a same hierarchical level of the graph as the first coverage point,
    wherein, when the sibling coverage point exists at the same hierarchical level, the second coverage point is the sibling coverage point.

10. The system of claim 9,
    wherein, when the sibling coverage point does not exist at the same hierarchical level, the second coverage point is a parent coverage point of the first coverage point.

11. The system of claim 8,
    wherein, when the first coverage point is partially hit by the predefined set, the second coverage point is the first coverage point.

12. The system of claim 8, wherein the generating the prospective test sequence comprises:
    generating, based on back-traversing the graph, a plurality of prospective test sequences that fully hit the first coverage point; and
    selecting, from the plurality of prospective test sequences, a most effective test sequence as the prospective test sequence.

13. The system of claim 8, wherein the determining that the first coverage point of the graph is not fully hit comprises:
- searching a verification database for the first coverage point;
- when the first coverage point is included in the verification database, determining whether the first coverage point is included the one or more test sequences; and
- when the first coverage point is not included in the verification database:
  - back-traversing the graph from the first coverage point to a third coverage point; and
  - searching the verification database for the third coverage point.

14. A computer program product for use with graph-based verification of a circuit design, the computer program product comprising:
- a computer-readable storage device having computer-readable program code embodied therewith, the computer-readable program code executable by one or more computer processors to perform an operation, comprising:
  - performing, using a graph referencing the circuit design, a predefined set of one or more test sequences;
  - determining that a first coverage point of the graph is not fully hit by the predefined set;
  - back-traversing the graph from a second coverage point of the graph that is partially hit or fully hit by the predefined set; and
  - generating, based on back-traversing the graph, a prospective test sequence to fully hit the first coverage point.

15. The computer program product of claim 14, the operation further comprising:
- determining whether a sibling coverage point exists at a same hierarchical level of the graph as the first coverage point,
- wherein, when the sibling coverage point exists at the same hierarchical level, the second coverage point is the sibling coverage point.

16. The computer program product of claim 15,
- wherein, when the sibling coverage point does not exist at the same hierarchical level, the second coverage point is a parent coverage point of the first coverage point.

17. The computer program product of claim 14,
- wherein, when the first coverage point is partially hit by the predefined set, the second coverage point is the first coverage point.

18. The computer program product of claim 14, wherein the generating the prospective test sequence comprises:
- generating, based on back-traversing the graph, a plurality of prospective test sequences that fully hit the first coverage point; and
- selecting, from the plurality of prospective test sequences, a most effective test sequence as the prospective test sequence.

19. The computer program product of claim 14, wherein the determining the first coverage point of the graph is not fully hit comprises:
- searching a verification database for the first coverage point; and
- when the first coverage point is included in the verification database, determining whether the first coverage point is included the one or more test sequences.

20. The computer program product of claim 19, the operation further comprising:
- when the first coverage point is not included in the verification database, back-traversing the graph from the first coverage point to a third coverage point; and
- searching the verification database for the third coverage point.

\* \* \* \* \*